US012777918B2

(12) United States Patent
Yoon

(10) Patent No.: US 12,777,918 B2
(45) Date of Patent: Oct. 27, 2026

(54) SEMICONDUCTOR DEVICE INCLUDING A PLUG STRUCTURE

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 252 days.

(21) Appl. No.: 18/499,224

(22) Filed: Nov. 1, 2023

(65) Prior Publication Data

US 2024/0332178 A1 Oct. 3, 2024

(30) Foreign Application Priority Data

Mar. 30, 2023 (KR) ........................ 10-2023-0041762

(51) Int. Cl.
*H10W 20/41* (2026.01)
*H10D 62/10* (2025.01)
(Continued)

(52) U.S. Cl.
CPC .......... *H10W 20/435* (2026.01); *H10D 62/10* (2025.01); *H10D 62/405* (2025.01); *H10W 20/4403* (2026.01)

(58) Field of Classification Search
CPC ........ H10D 62/10–111; H10D 62/405; H10W 20/435
See application file for complete search history.

(56) References Cited

U.S. PATENT DOCUMENTS

2005/0001290 A1* 1/2005 Chan .................. H10D 84/0167 257/369
2006/0284249 A1* 12/2006 Chen .................... H10D 30/792 257/E21.336
(Continued)

FOREIGN PATENT DOCUMENTS

KR 10-2011-0077948 A 7/2011
KR 10-2011-0126931 A 11/2011
(Continued)

OTHER PUBLICATIONS

M. V. Gomoyunova et al., Initial stages of cobalt disilicide formation on silicon single crystals, Physics of Low-Dimensional Structures, Nos. 3-4, pp. 167-186, 2002.
(Continued)

*Primary Examiner* — Errol V Fernandes
(74) *Attorney, Agent, or Firm* — IP&T GROUP LLP

(57) ABSTRACT

A semiconductor device includes a substrate having a first active region and a second active region; a first ion implantation region in the first active region of the substrate; a first plug structure over the first active region to be vertically aligned with the first ion implantation region; a second ion implantation region in the second active region of the substrate; and a second plug structure over the second active region to be vertically aligned with the second ion implantation region. The first ion implantation region includes a first outer ion implantation region and a first inner ion implantation region. The first outer ion implantation region surrounds at least one surface of the first inner ion implantation region. The first outer ion implantation region includes at least one of carbon (C) ions and fluorine (F) ions. The first inner ion implantation region includes at least one of germanium (Ge) ions and boron (B) ions.

20 Claims, 17 Drawing Sheets

(51) Int. Cl.
*H10D 62/40* (2025.01)
*H10W 20/44* (2026.01)

(56) References Cited

U.S. PATENT DOCUMENTS

| | | | | |
|---|---|---|---|---|
| 2012/0313151 A1* | 12/2012 | Lee | H10W 20/083 257/288 |
| 2013/0171795 A1* | 7/2013 | Pei | H10P 30/222 438/303 |
| 2015/0263168 A1* | 9/2015 | Hsiao | H10D 30/751 438/301 |
| 2023/0268402 A1* | 8/2023 | Hung | H10D 30/797 438/666 |

FOREIGN PATENT DOCUMENTS

| | | | |
|---|---|---|---|
| KR | 10-2012-0007678 | A | 1/2012 |
| KR | 10-2016-0035453 | A | 3/2016 |
| KR | 10-2016-0125209 | A | 10/2016 |
| KR | 10-1669470 | B1 | 10/2016 |
| KR | 10-2016-0134447 | A | 11/2016 |
| KR | 10-2017-0100202 | A | 9/2017 |
| KR | 10-2021-0061486 | A | 5/2021 |
| KR | 10-2022-0001469 | A | 1/2022 |
| KR | 10-2022-0001569 | A | 1/2022 |

OTHER PUBLICATIONS

Office Action for Korea Patent Application No. 10-2023-0041762 issued by the Korean Patent Office on Sep. 11, 2026.

* cited by examiner

SEMICONDUCTOR DEVICE INCLUDING A PLUG STRUCTURE

CROSS-REFERENCE TO RELATED APPLICATION

The present application claims priority to Korean Patent Application No. 10-2023-0041762, filed on Mar. 30, 2023, which is incorporated herein by reference in its entirety.

BACKGROUND

1. Technical Field

The present disclosure relates to a semiconductor device and a method of manufacturing the semiconductor device.

2. Related Art

Metal silicides have been considered for high integration and high-speed operation of semiconductor devices.

SUMMARY

One embodiment of the present disclosure provides a semiconductor device including a plug structure having a metal silicide layer.

Another embodiment of the present disclosure provides a method of manufacturing a semiconductor device including a plug structure having a metal silicide layer.

In accordance with one embodiment of the present disclosure, a semiconductor device includes a substrate having a first active region and a second active region; a first ion implantation region in the first active region of the substrate; a first plug structure over the first active region to be vertically aligned with the first ion implantation region; a second ion implantation region in the second active region of the substrate; and a second plug structure over the second active region to be vertically aligned with the second ion implantation region. The first ion implantation region includes a first outer ion implantation region and a first inner ion implantation region. The first outer ion implantation region surrounds at least one surface of the first inner ion implantation region. The first outer ion implantation region includes at least one of carbon (C) ions and fluorine (F) ions. The first inner ion implantation region includes at least one of germanium (Ge) ions and boron (B) ions.

In accordance with another embodiment of the present disclosure, a semiconductor device includes a first transistor structure in a first area of a substrate. The first transistor structure includes a first gate structure; a first ion implantation region in a first active region in the first area of the substrate to be adjacent to the first gate structure; and a first plug structure extending in a vertical direction over the first active region to be vertically aligned with the first ion implantation region. The first ion implantation region includes a first outer ion implantation region and a first inner ion implantation region. The first outer eThe first outer ion implantation region includes at least one of carbon (C) ions and fluorine (F) ions. The first inner ion implantation region includes at least one of germanium (Ge) ions and boron (B) ions.

In accordance with still another embodiment of the present disclosure, a method of manufacturing a semiconductor device includes forming a first gate structure and a second gate structure over a first active region and a second active region, respectively; forming a first interlayer insulating layer over the first and second active regions covering the first and second gate structures; forming a first hole and a second hole vertically penetrating the first interlayer insulating layer and exposing side surfaces of the first and second active regions, respectively; conformally forming a lining layer on inner walls and bottom surfaces of the first and second holes; forming a first ion implantation region in the first active region under a bottom surface of the first hole by performing a first ion implantation process using the lining layer as a first ion implantation buffer; exposing the first and second active regions in lower portions of the first and second holes by removing portions of the lining layer on the bottom surfaces of the first and second holes; forming a second ion implantation region in the second active region exposed in the second hole by performing a second ion implantation process; expanding volumes of the first ion implantation region and the second ion implantation region by performing a diffusion process; and forming first and second plugs in the first and second holes, respectively. The first ion implantation process may include implanting first ions, second ions, and third ions into the first active region. The first ions may be germanium (Ge) ions. The second ions may be at least one of carbon (C) ions and fluorine (F) ions. The third ions may be boron (B) ions.

In accordance with a further embodiment of the present disclosure, a method of manufacturing a semiconductor device includes forming a first interlayer insulating layer on first and second active regions; forming first and second holes vertically penetrating the first interlayer insulating layer to expose portions of surfaces of the first and second active regions, respectively; forming a first ion implantation region in the first active region under the first hole by performing a first ion implantation process; forming a second ion implantation region in the second active region under the second hole by performing a second ion implantation process; expanding volumes of the first and the second ion implantation regions by performing a diffusion process; and forming first and second plug structures in the first and second holes, respectively. The first ion implantation process includes implanting first ions, second ions, and third ions into the first active region. The second ion implantation process includes implanting at least one of arsenic (As) ions and phosphorus (P) ions into the second active region. The first ions include amorphization ions. The second ions include diffusion inhibition ions. The third ions include boron (B) ions.

DETAILED DESCRIPTION

Figure 1:
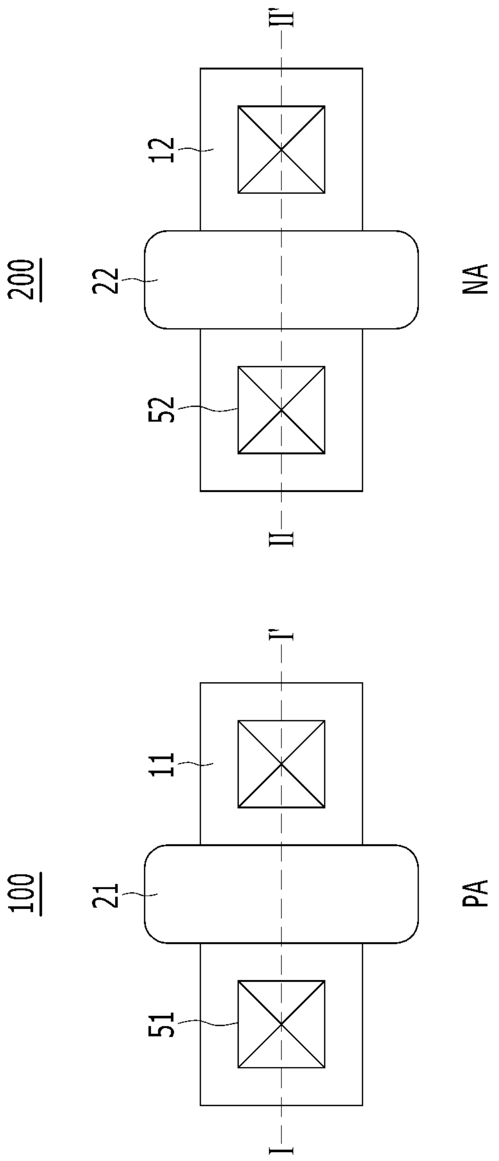
FIG. 1 is a layout of a semiconductor device according to one embodiment of the present disclosure.

Various examples and implementations of the disclosed technology are described below in detail with reference to the accompanying drawings. The drawings may not necessarily be to scale and in some instances, proportions of structures in the drawings may have been exaggerated to clearly illustrate certain features of the described examples or implementations. In presenting a specific example in a drawing or detailed description having two or more layers in a multi-layer structure, the relative positioning relationship of such layers or the sequence of arranging the layers as shown reflects a particular implementation for the described or illustrated example, and a different relative positioning relationship or sequence of arranging the layers may be possible. Throughout the disclosure, like reference numerals refer to like parts in the various figures and embodiments of the present disclosure. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a layout of a semiconductor device according to one embodiment of the present disclosure. Referring to FIG. 1, the semiconductor device may include a first transistor structure 100 disposed in a first area PA and a second transistor structure 200 disposed in a second area NA. For example, the first area PA may be a PMOS transistor area, and the second area NA may be an NMOS transistor area. Accordingly, the first transistor structure 100 may include a PMOS transistor structure, and the second transistor structure 200 may include an NMOS transistor structure.

The first transistor structure 100 may include a first active region 11, a first gate structure 21, and a first plug structure 51 disposed in the first area PA. The second transistor structure 200 may include a second active region 12, a second gate structure 22, and a second plug structure 52 disposed in the second area NA. The first gate structure 21 may cross the first active region 11, and the second gate structure 22 may cross the second active region 12. The first plug structure 51 may be disposed on the first active region 11, and the second plug structure 52 may be disposed on the second active region 12.

Figure 2:
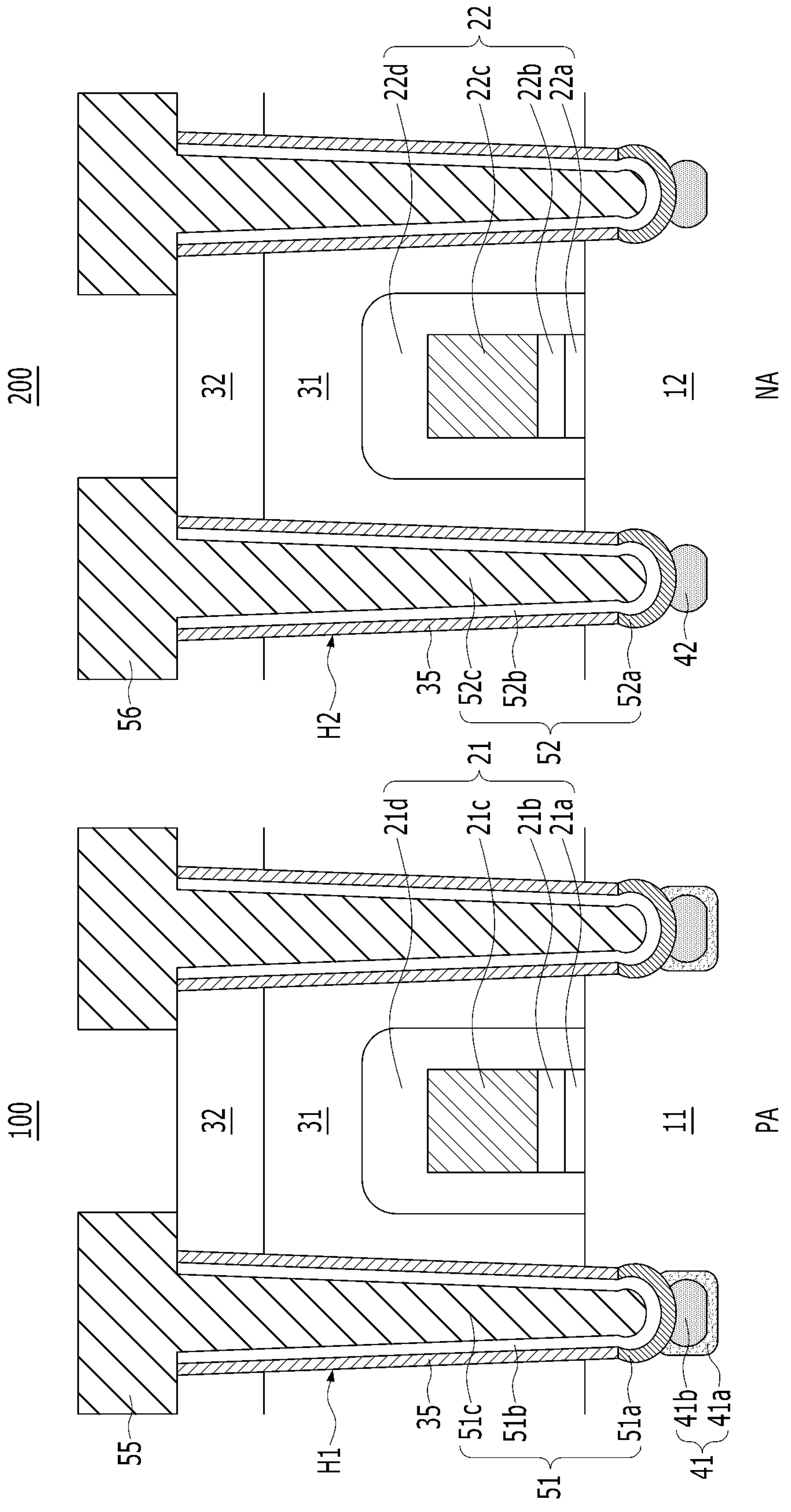
FIG. 2 is a longitudinal cross-sectional view taken along lines I-I' and II-II' of FIG. 1 to describe a semiconductor device according to another embodiment of the present disclosure.

FIG. 2 is a longitudinal cross-sectional view taken along lines I-I' and II-II' of FIG. 1 to describe a semiconductor device according to another embodiment of the present disclosure. Referring to FIG. 2, the semiconductor device may include the first transistor structure 100 and the second transistor structure 200. The first transistor structure 100 may include the first gate structure 21 formed on the first active region 11 in the first area PA and first ion implantation regions 41 formed in the first active region 11 adjacent to the first gate structure 21. The second transistor structure 200 may include the second gate structure 22 formed on the second active region 12 in the second area NA and second ion implantation regions 42 formed in the second active region 12 adjacent to the second gate structure 22. The first transistor structure 100 may further include first plug structures 51 extending in a vertical direction. The second transistor structure 200 may further include second plug structures 52 extending in the vertical direction. Each of the first ion implantation regions 41 and each of the first plug structures 51 may be vertically aligned with each other. Each of the second ion implantation regions 42 and each of the second plug structures 52 may be vertically aligned with each other. The first gate structure 21 may correspond to the PMOS gate structure, and the second gate structure 22 may correspond to the NMOS gate structure.

Each of the first and second active regions 11 and 12 may include a doped semiconductor substrate. Each of the first and second active regions 11 and 12 may be single-crystal silicon layers with an {100} crystal plane at the top surface thereof. Each of the first and second active regions 11 and 12 having the {100} crystal plane may have a transistor channel direction rotated 45° (at an angle of 45°) with respect to a notch or a flat zone of a wafer. In another embodiment, each of the first and second active regions 11 and 12 may have an {110} crystal plane at a top surface thereof.

The semiconductor device may further include first and second interlayer insulating layers 31 and 32 surrounding the first and second gate structures 21 and 22, and the first and second plug structures 51 and 52. The first interlayer insulating layer 31 may be formed on the first and second active regions 11 and 12 to cover the first and second gate structures 21 and 22. The first interlayer insulating layer 31 may surround lower portions of side surfaces of the first and second plug structures 51 and 52. The second interlayer insulating layer 32 may be formed on the first interlayer insulating layer 31 to surround upper portions of the side surfaces of the first and second plug structures 51 and 52. The first interlayer insulating layer 31 and the second interlayer insulating layer 32 may have an etching selectivity to each other. For example, the first interlayer insulating layer 31 may include a silicon oxide-based insulating material, and the second interlayer insulating layer 32 may include a silicon nitride-based insulating material.

The first gate structure 21 may include a first gate insulating layer **21*a*, a first gate barrier layer 21*b*, a first gate electrode 21*c*, and a first gate capping layer 21*d*. The second gate structure 22 may include a second gate insulating layer 22*a*, a second gate barrier layer 22*b*, a second gate electrode 22*c*, and a second gate capping layer 22*d***.

The first and second gate insulating layers **21*a* and 22*a* may be directly formed on the first and second active regions 11 and 12, respectively. Each of the first and second gate insulating layers 21*a* and 22*a* may include at least one of silicon oxide, a high-k insulating material, or a combination thereof. The high-k insulating material may include one or more metal oxides such as, for example, hafnium oxide (HfO2) or zirconium oxide (ZrO2). In one embodiment, the first and second gate insulating layers 21*a* and 22*a* may further include interface insulating layers formed by oxidizing surfaces of the first and second active regions 11 and 12, respectively. In another embodiment, each of the first and second gate insulating layers 21*a* and 22*a* may have a U-shaped longitudinal section. For example, lower surfaces of the first and second gate insulating layers 21*a* and 22*a* may be in contact with the first and second active regions 11 and 12, respectively, and outer surfaces of the first and second gate insulating layers 21*a* and 22*a* may be in contact with the first and second gate capping layers 21*d* and 22*d***, respectively.

The first and second gate barrier layers **21*b* and 22*b* may be formed on the first and second gate insulating layers 21*a* and 22*a*, respectively. Each of the first and second gate barrier layers 21*b* and 22*b* may include a conductive metal nitride layer such as for example a titanium nitride (TiN) layer, a tantalum nitride (TaN) layer, or a tungsten nitride (WN) layer or a combination thereof. In one embodiment, the first gate barrier layer 21*b* may be omitted. In another embodiment, each of the first and second gate barrier layers 21*b* and 22*b* may have a U-shaped longitudinal section. For example, the first and second gate barrier layers 21*b* and 22*b*** may surround lower surfaces and side surfaces of the first and second gate electrodes 21*c* and 22*c*, respectively.

Each of the first and second gate electrodes 21*c* and 22*c* may include a metal electrode such as for example one or more of tungsten (W) or a metal nitride electrode such as for example titanium nitride (TiN). In one embodiment, the second gate electrode 22*c* may further include a work function adjusting layer. The work function adjusting layer may include one or more of a metal alloy layer such as for example titanium aluminum (TiAl) or a metal compound layer such as titanium aluminum nitride (TiAlN) or a combination thereof.

The first gate capping layer 21*d* may surround side surfaces and top surfaces of the first gate insulating layer 21*a*, the first gate barrier layer 21*b*, and the first gate electrode 21*c*. The second gate capping layer 22*d* may surround side surfaces and top surfaces of the second gate insulating layer 22*a*, the second gate barrier layer 22*b*, and the second gate electrode 22*c*. That is, the first gate capping layer 21*d* may include first gate spacers formed on the side surfaces of the first gate insulating layer 21*a*, the first gate barrier layer 21*b*, and the first gate electrode 21*c*. The second gate capping layer 22*d* may include second gate spacers formed on the side surfaces of the second gate insulating layer 22*a*, the second gate barrier layer 22*b*, and the second gate electrode 22*c*. In one embodiment, the first gate capping layer 21*d* may be formed only on the side surfaces of the first gate insulating layer 21*a*, the first gate barrier layer 21*b*, and the first gate electrode 21*c*. In one embodiment, the second gate capping layer 22*d* may be formed only on the side surfaces of the second gate insulating layer 22*a*, the second gate barrier layer 22*b*, and the second gate electrode 22*c*.

The first ion implantation regions 41 may be formed in the first active region 11 to be in contact with a lower end of the first plug structure 51. The second ion implantation regions 42 may be formed in the second active region 12 to be in contact with a lower end of the second plug structure 52. The first ion implantation regions 41 may include first outer ion implantation regions 41*a* and first inner ion implantation regions 41*b*. The first outer ion implantation regions 41*a* may include carbon (C) ions and/or fluorine (F) ions and therefore may include C and/or F. The first inner ion implantation regions 41*b* may include germanium (Ge) ions and/or boron (B) ions and therefore may include Ge and/or B. The first outer ion implantation regions 41*a* may not include boron (B) ions. The first inner ion implantation regions 41*b* may further include carbon (C) ions and/or fluorine (F) ions and therefore may include C and/or F.

The first outer ion implantation regions 41*a* may surround the first inner ion implantation regions 41*b*. For example, the first outer ion implantation regions 41*a* may surround at least one surface (e.g., a bottom surface) of the first inner ion implantation regions 41*b*. In one embodiment, the first outer ion implantation regions 41*a* may surround at least side surfaces of the first inner ion implantation regions 41*b*. In another embodiment, the first outer ion implantation regions 41*a* may surround the side surfaces and the bottom surfaces of the first inner ion implantation regions 41*b*. In another embodiment, the first outer ion implantation regions 41*a* may surround the side surfaces, the bottom surfaces, and top surfaces of the first inner ion implantation regions 41*b*. That is, a profile of the illustrated first ion implantation regions 41 shown in FIG. 2 is but one example. The second ion implantation regions 42 may include arsenic (As) ions, phosphorus (P) ions, or a combination thereof. The carbon (C) ions and fluorine (F) ions implanted in the first outer ion implantation regions 41*a* may prevent, block, or retard diffusion of boron (B) ions in the first inner ion implantation regions 41*b*, and hence ions which retard diffusion are examples of diffusion inhibition ions. Germanium (Ge) ions implanted in the first ion implantation regions 41 may facilitate diffusion of boron (B) ions. Each of the second ion implantation regions 42 may be single regions.

The first ion implantation regions 41 may correspond to source/drain regions of the first transistor structure 100. Accordingly, the first active region 11 may be an N-well region including N-type ions such as arsenic (As) ions or phosphorus (P) ions, and the first ion implantation regions 41 may include P-type ions such as boron (B) ions as carriers. In addition, the second ion implantation regions 42 may correspond to source/drain regions of the second transistor structure 200. Accordingly, the second active region 12 may be a P-well region including P-type ions such as boron (B) ions, and the second ion implantation regions 42 may include N-type ions such as arsenic (As) ions or phosphorus (P) ions as carriers.

The first plug structures 51 may include first metal silicide layers 51*a*, first plug barrier layers 51*b*, and first plugs 51*c*. The second plug structures 52 may include second metal silicide layers 52*a*, second plug barrier layers 52*b* and second plugs 52*c*. Each of the first and second plug structures 51 and 52 may further include insulating lining layers 35. Lower ends of the first and second plug structures 51 and 52 may protrude downward into the first and second active regions 11 and 12, respectively. That is, the surfaces of the first and second active regions 11 and 12 which are in contact with the lower ends of the first and second plug structures 51 and 52 may be recessed lower than the surfaces of the first and second active regions 11 and 12 in which the first and second gate structures 21 and 22 are formed. Each of the lower ends of the first and second plug structures 51 and 52 may have a bulb shape or a spherical shape. That is, each of the lower ends of the first and second plugs 51*c* and 52*c* may expand in a bulb shape or a spherical shape.

The first and second plugs 51*c* and 52*c* may have a pillar shape filling the first and second holes H1 and H2, respectively. Each of the first and second plugs 51*c* and 52*c* may include a metal such as for example tungsten (W).

The first and second plug barrier layers 51*b* and 52*b* may conformally surround side and bottom surfaces of the first and second plugs 51*c* and 52*c*, respectively. Each of the first and second plug barrier layers 51*b* and 52*b* may have a cylindrical shape. Each of the first and second plug barrier layers 51*b* and 52*b* may include one or more of a metal or a metal nitride such as, for example, titanium (Ti), titanium nitride (TiN), tantalum (Ta), tantalum nitride (TaN), tungsten nitride (WN), or combinations thereof.

The first and second metal silicide layers 51*a* and 52*a* may conformally surround bottom surfaces of the first and second plug barrier layers 51*b* and 52*b* at the lower ends of the first and second plug structures 51 and 52, respectively. Each of the first and second metal silicide layers 51*a* and 52*a* may be formed in a liner shape in bottom portions of the first and second holes H1 and H2. For example, each of the first and second metal silicide layers 51*a* and 52*a* may have a bowl shape. Each of the first and second metal silicide layers 51*a* and 52*a* may include for example cobalt silicide (CoSi). In some embodiments, each of the first and second metal silicide layers 51*a* and 52*a* may include at least one or more of nickel silicide (NiSi), tungsten silicide (WSi), titanium silicide (TiSi), and other metal silicide materials, and combinations thereof.

Each of the insulating lining layers 35 may be formed in a liner shape on inner walls of the first and second holes H1 and H2. Each of the insulating lining layers 35 may conformally surround outer surfaces of the first and second plug barrier layers 51*b* and 52*b*. Each of the insulating lining layers 35 may have a cylindrical shape. Lower portions of the insulating lining layers 35 may extend into the first and second active regions 11 and 12, respectively. That is, outer surfaces of the lower portions of the insulating lining layers 35 may be in contact with the first and second active regions 11 and 12, respectively. The lower ends of the insulating lining layers 35 may be in contact with upper ends of the first and second metal silicide layers 51*a* and 52*a*, respectively. The maximum horizontal width of each of the first and second metal silicide layers 51*a* and 52*a* may be greater than the width of each of the lower ends of the insulating lining layers 35.

Cobalt (Co) may easily diffuse in an <111> crystal direction. Accordingly, the crystalline structure of cobalt silicide (CoSi) may be formed in unstable shapes in a direction different from the channel direction in the {100} crystal plane. For example, cobalt sticks may occur along the <111> crystal direction. Leakage current may occur through the cobalt protrusions. In one embodiment of this disclosure, amorphous ions and diffusion block ions may be implanted into the first and second active regions 11 and 12 to block the diffusion of cobalt (Co) ions.

The insulating lining layer 35 may be formed in a liner shape on inner walls of the first and second holes H1 and H2. The insulating lining layer 35 may conformally surround outer surfaces of the first and second plug barrier layers 51*b* and 52*b*. The insulating lining layer 35 may have a cylindrical shape. Lower portions of the insulating lining layer 35 may extend into the first and second active regions 11 and 12. That is, outer surfaces of the lower portions of the insulating lining layer 35 may be in contact with the first and second active regions 11 and 12. Lower end portions of the insulating lining layer 35 may be in contact with upper end portions of the first and second metal silicide layers 51*a* and 52*a*. The maximum horizontal widths of the first and second metal silicide layers 51*a* and 52*a* may be greater than widths of lower ends of the insulating lining layer 35.

Since each of the lower ends of the first and second plug structures 51 and 52 may have a bulb shape, each of the contact areas between the first and second plug structures 51 and 52 and the first and second active regions 11 and 12 may increase. Accordingly, contact resistance between the first and second plug structures 51 and 52 and the first and second active regions 11 and 12 may be lowered.

Figure 3:
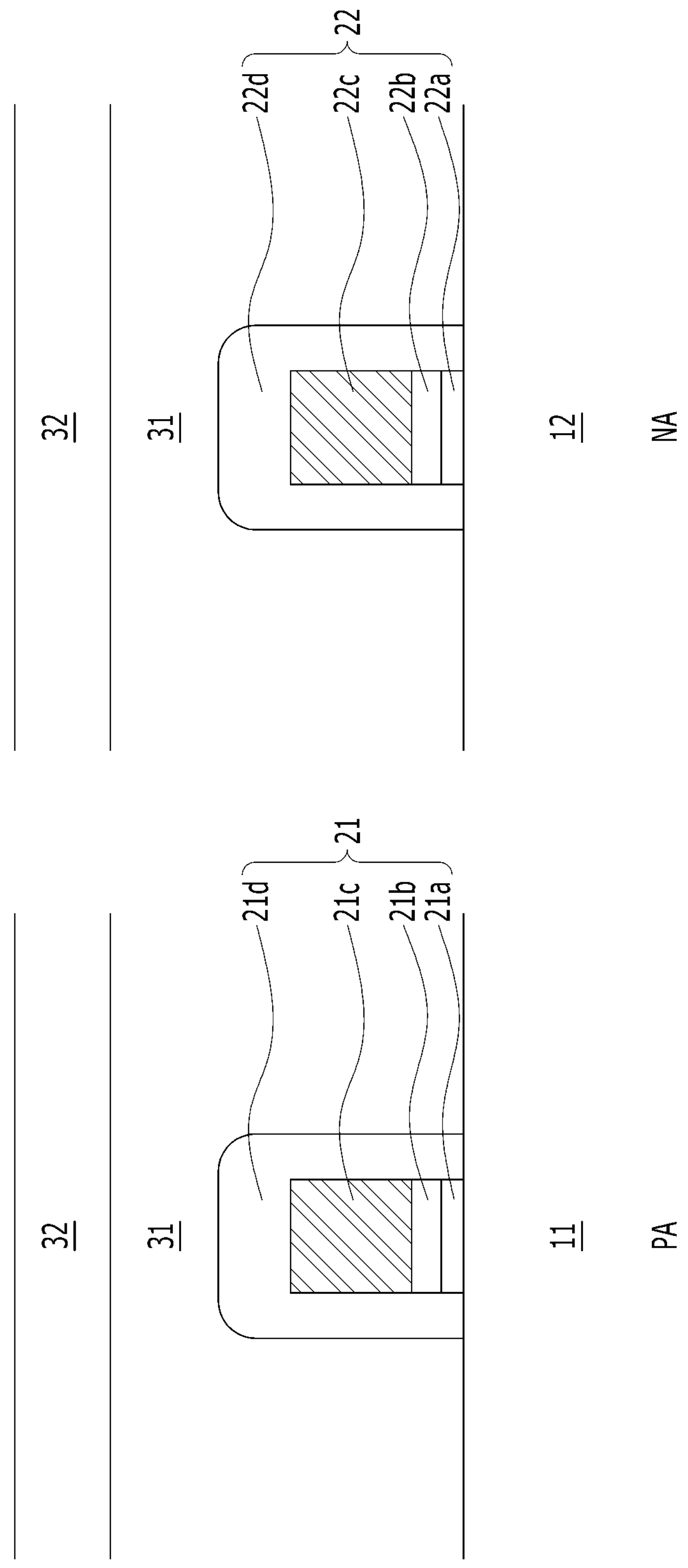
FIGS. 3 to 17 are longitudinal cross-sectional views taken along the lines I-I' and II-II' of FIG. 1 to describe a method of manufacturing a semiconductor device according to various embodiments of the present disclosure.

FIGS. 3 to 17 are longitudinal cross-sectional views taken along the lines I-I' and II-II' of FIG. 1 to describe a method of manufacturing a semiconductor device according to various embodiments of the present disclosure. Referring to FIG. 3, the method may include forming a first gate structure 21 and a second gate structure 22 on a first active region 11 and a second active region 12, respectively.

Forming the first and second gate structures 21 and 22 may include forming a gate insulating material layer, a gate barrier material layer, and a gate electrode material layer on the first and second active regions 11 and 12; patterning the gate insulating material layer, the gate barrier material layer, and the gate electrode material layer by performing a photolithography process and an etching process to form first and second gate insulating layers 21*a* and 22*a*, first and second gate barrier layers 21*b* and 22*b*, and first and second gate electrodes 21*c* and 22*c*; and forming first and second gate capping layers 21*d* and 22*d* on side surfaces and top surfaces of the first and second gate insulating layers 21*a* and 22*a*, the first and second gate barrier layers 21*b* and 22*b*, and the first and second gate electrodes 21*c* and 22*c* by performing a deposition process and an etching process, respectively. The first and second gate capping layers 21*d* and 22*d* may include gate spacers formed on side surfaces of the first and second gate insulating layers 21*a* and 22*a*, the first and second gate barrier layers 21*b* and 22*b*, and the first and second gate electrodes 21*c* and 22*c*, respectively. The method may further include forming a first interlayer insulating layer 31 surrounding the first and second gate structures 21 and 22, and forming a second interlayer insulating layer 32 on the first interlayer insulating layer 31. Forming the first interlayer insulating layer 31 and the second interlayer insulating layer 32 may include forming a silicon oxide layer and a silicon nitride layer using deposition processes, respectively. For example, the first interlayer insulating layer 31 and the second interlayer insulating layer 32 may have etching selectivity with respect to each other.

Figure 4:
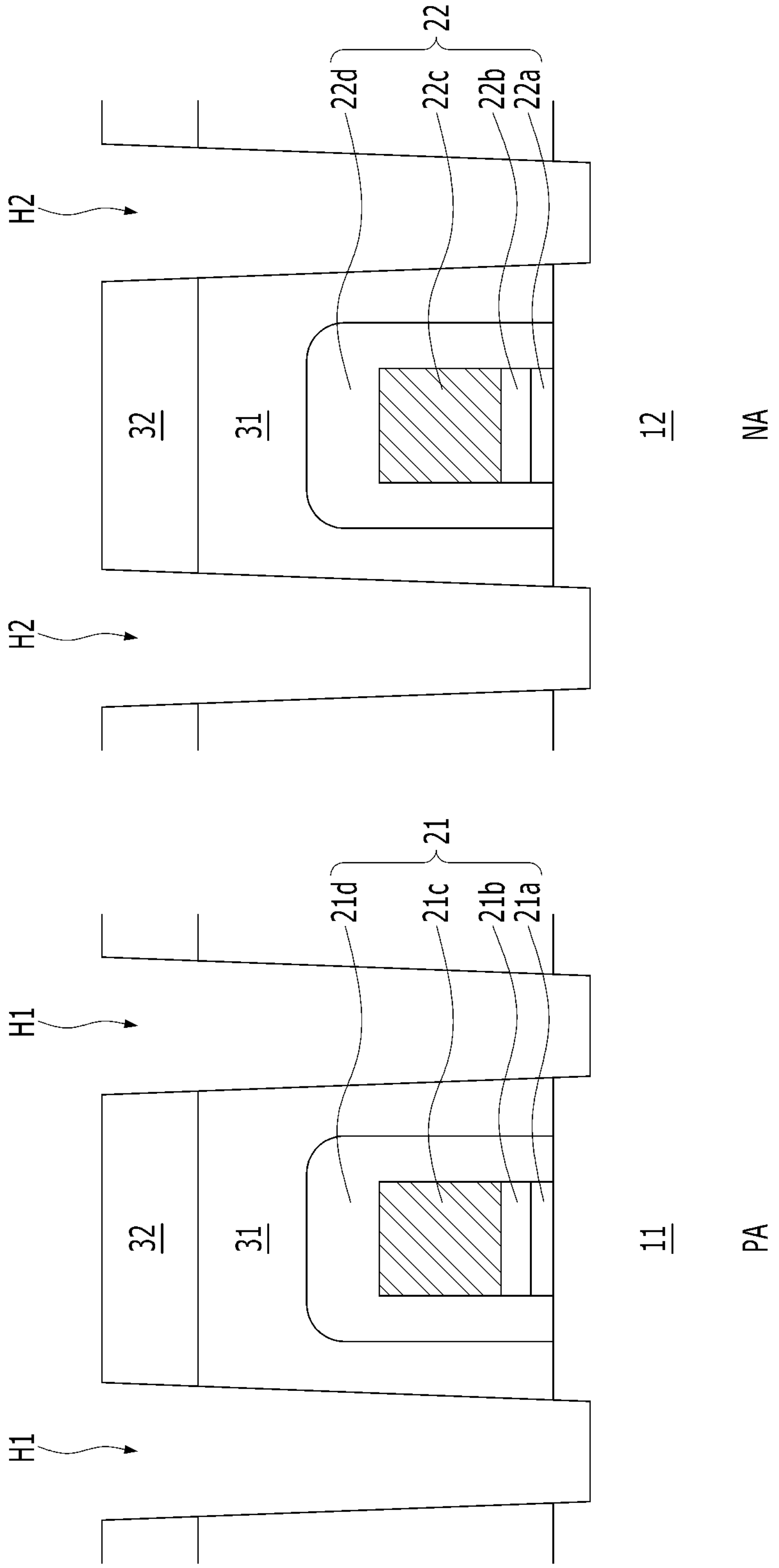

Referring to FIG. 4, the method may further include forming first holes H1 and second holes H2 vertically penetrating the first and second interlayer insulating layers 31 and 32 to expose surfaces of the first and second active regions 11 and 12, respectively. The first holes H1 may be formed to be close to the first gate structure 21 in the first area PA, and the second holes H2 may be formed to be close to the second gate structure 22 in the second area NA, respectively. Lower portions of the first and second holes H1 and H2 may protrude downward into the first and second active regions 11 and 12, respectively. That is, in this embodiment, the surfaces of the first and second active regions 11 and 12 exposed in the lower portions of the first and second holes H1 and) H2 are recessed lower than the surfaces of the first and second active regions 11 and 12 that are not exposed in the first and second holes H1 and H2, respectively.

Figure 5:
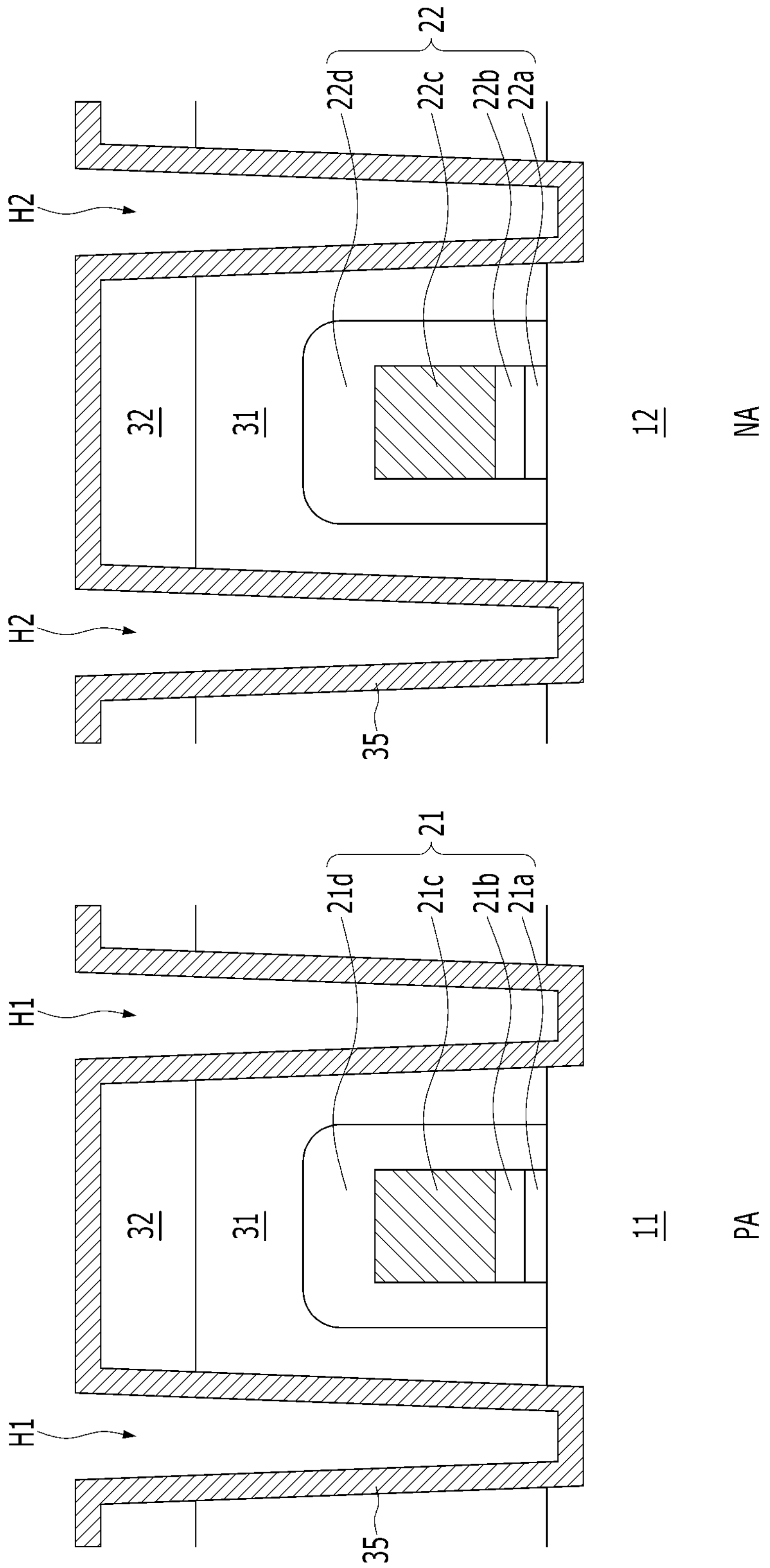

Referring to FIG. 5, the method may further include conformally forming lining layers 35 on surfaces of the first and second active regions 11 and 12, exposed by the first and second holes H1 and H2, on inner walls of the first and second holes H1 and H2, and on the lower portions (bottom surfaces) of the first and second holes H1 and H2. The lining layer 35 may also be formed on a top surface of the second interlayer insulating layer 32. The lining layer 35 may include an insulating material having an etching selectivity with respect to the first interlayer insulating layer 31. For example, the lining layer 35 may include a silicon nitride layer. Forming the lining layer 35 may include performing a deposition process such as an atomic layer deposition (ALD) process or a chemical vapor deposition (CVD) process. The lining layer 35 may have a thickness of about 40 to 60 Å.

Figure 6:
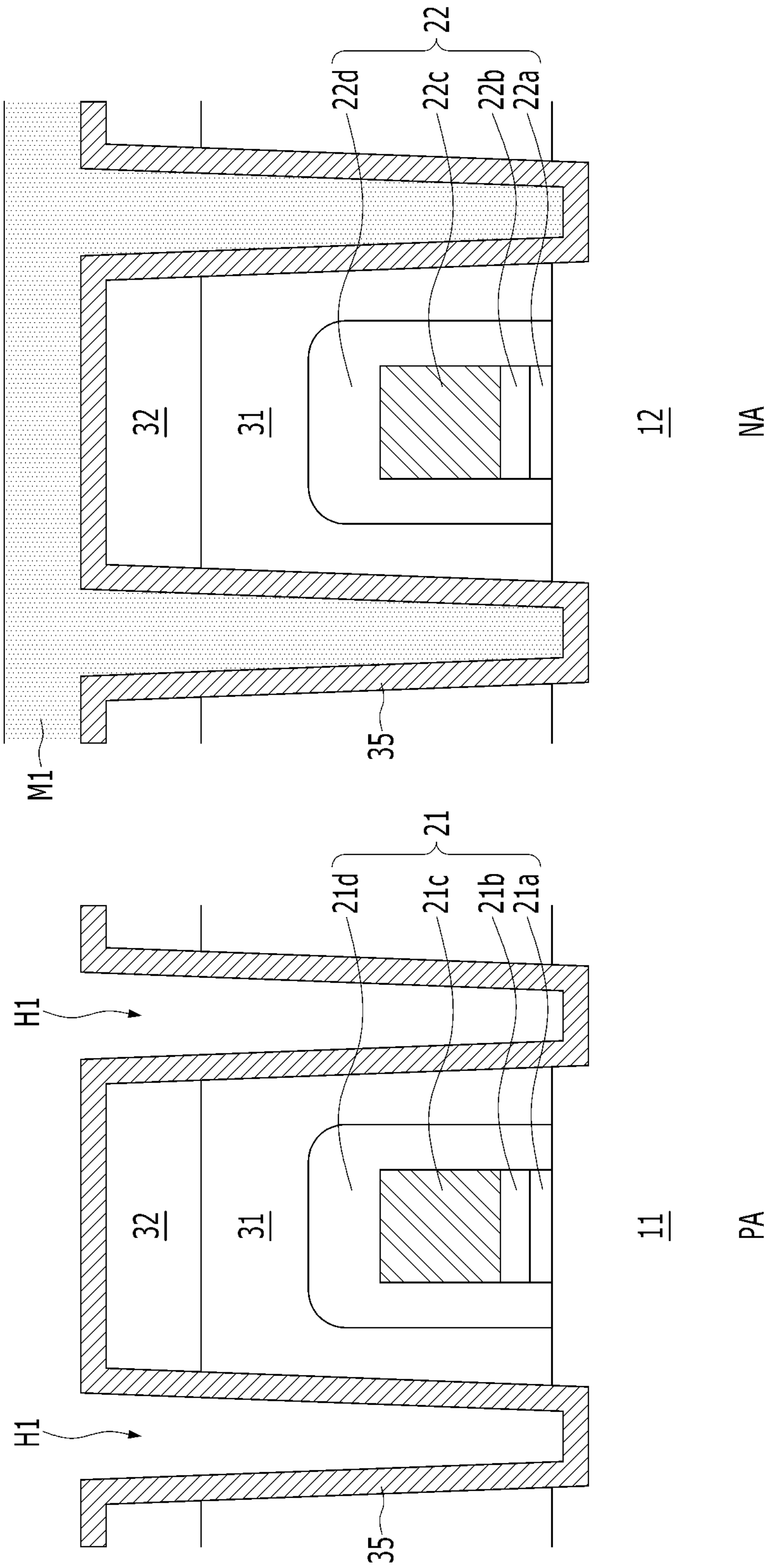

Referring to FIG. 6, the method may further include forming a first mask pattern M1 exposing the first area PA and covering the second area NA. The first mask pattern M1 may fill the second holes H2. Forming the first mask pattern M1 may include performing a photolithography process. For example, the first mask pattern M1 may include a polymeric organic material such as a photoresist.

Figure 7:
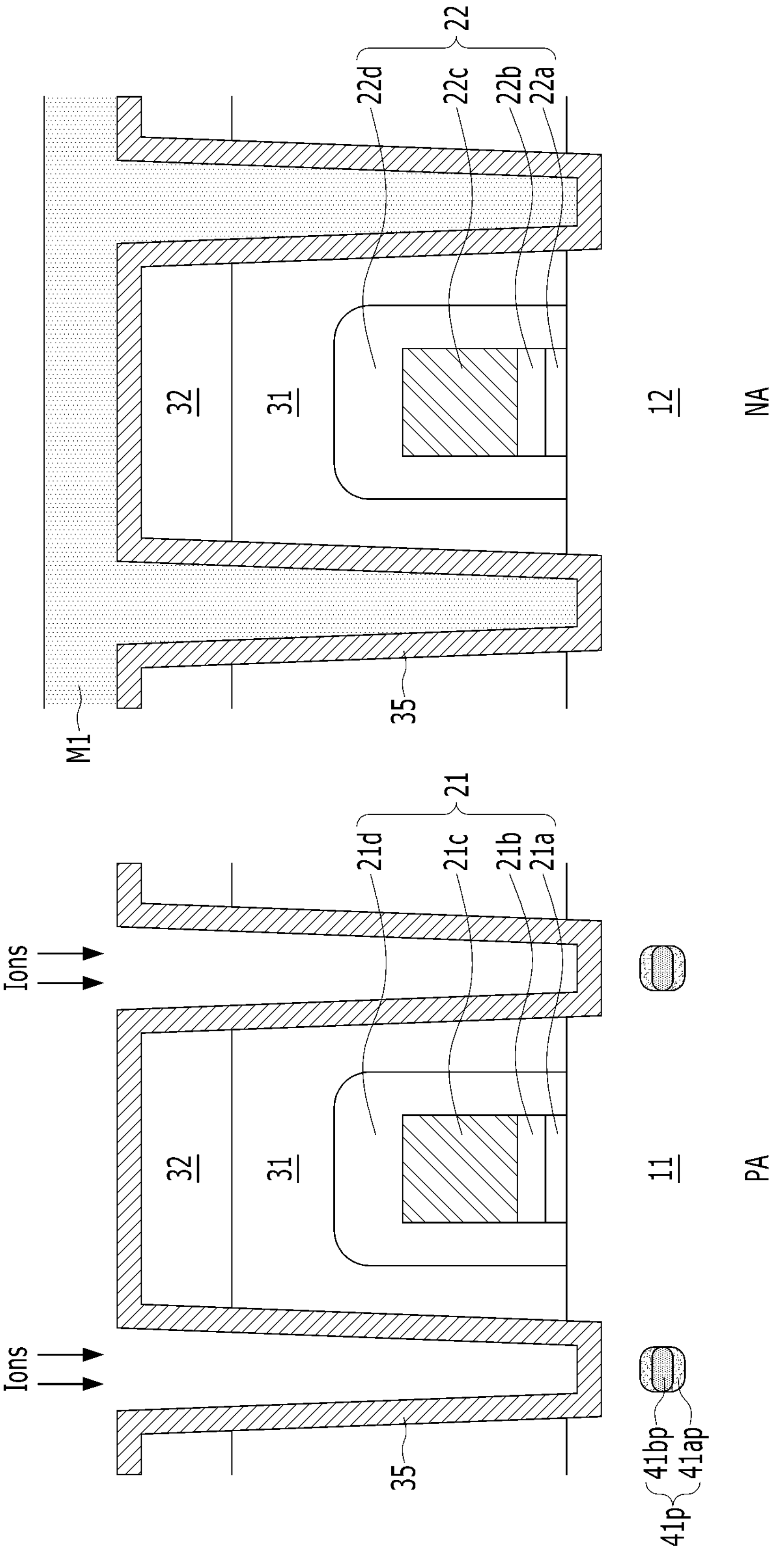

Referring to FIG. 7, the method may further include forming first preliminary ion implantation regions 41*p* in the first active region 11 exposed in the lower portions of the first holes H1 by performing the first ion implantation process. The first ion implantation process may be performed by using the lining layer 35 on the bottom surfaces of the first holes H1 as an ion implantation buffer. Each of the first preliminary ion implantation regions 41*p* may include first preliminary outer ion implantation regions 41*ap* and first preliminary inner ion implantation regions 41*bp*.

The first preliminary outer ion implantation regions 41*ap* may include carbon (C) ions or fluorine (F) ions. The first preliminary inner ion implantation regions 41*bp* may include germanium (Ge) ions, carbon (C) ions, and/or boron (B) ions. The first ion implantation process may include a primary ion implantation process, a secondary ion implantation process, and a tertiary ion implantation process. The primary ion implantation process may include an amorphization ion implantation process. For example, the primary ion implantation process may include implanting germanium (Ge) ions into the first active region 11. By performing the first ion implantation process, single-crystal silicon structures of the first preliminary ion implantation regions 41*p* may be amorphized, and hence ions that convert single-crystal silicon structures into amorphous silicon are examples of amorphization ions. The secondary ion implantation process may include a diffusion inhibition ion implantation process. For example, the secondary ion implantation process may include implanting carbon (C) ions and/or fluorine (F) ions into the first active region 11. The tertiary ion implantation process may include a dopant ion implantation process. For example, the tertiary ion implantation process may include implanting boron (B) ions into the first active region 11. The boron (B) ions may provide conductivity to the first active region 11. The primary ion implantation process may be performed with an energy of 25 to 40 keV and an ion dose of 1E15/cm2. The secondary ion implantation process may be performed with an energy of about 7 keV and an ion dose of 1E15/cm2. The tertiary ion implantation process may be performed with an energy of about 3 keV or more and an ion dose of 3E15/cm2. The first preliminary outer ion implantation regions 41*ap* may be formed to surround the first preliminary inner ion implantation regions 41*bp*. For example, the first preliminary outer ion implantation regions 41*ap* may be formed to surround at least one surface (e.g., a bottom surface) of the first preliminary inner ion implantation regions 41*bp*. In one embodiment, the first preliminary outer ion implantation regions 41*ap* may be formed to surround at least side surfaces of the first preliminary inner ion implantation regions 41*bp*. In another embodiment, the first preliminary outer ion implantation regions 41*ap* may be formed to surround the side surfaces and the bottom surfaces of the first preliminary inner ion implantation regions 41*bp*. In another embodiment, the first preliminary outer ion implantation regions 41*ap* may be formed to surround the side surfaces, the bottom surface, and the top surfaces of the first preliminary inner ion implantation regions 41*bp*.

Figure 8:
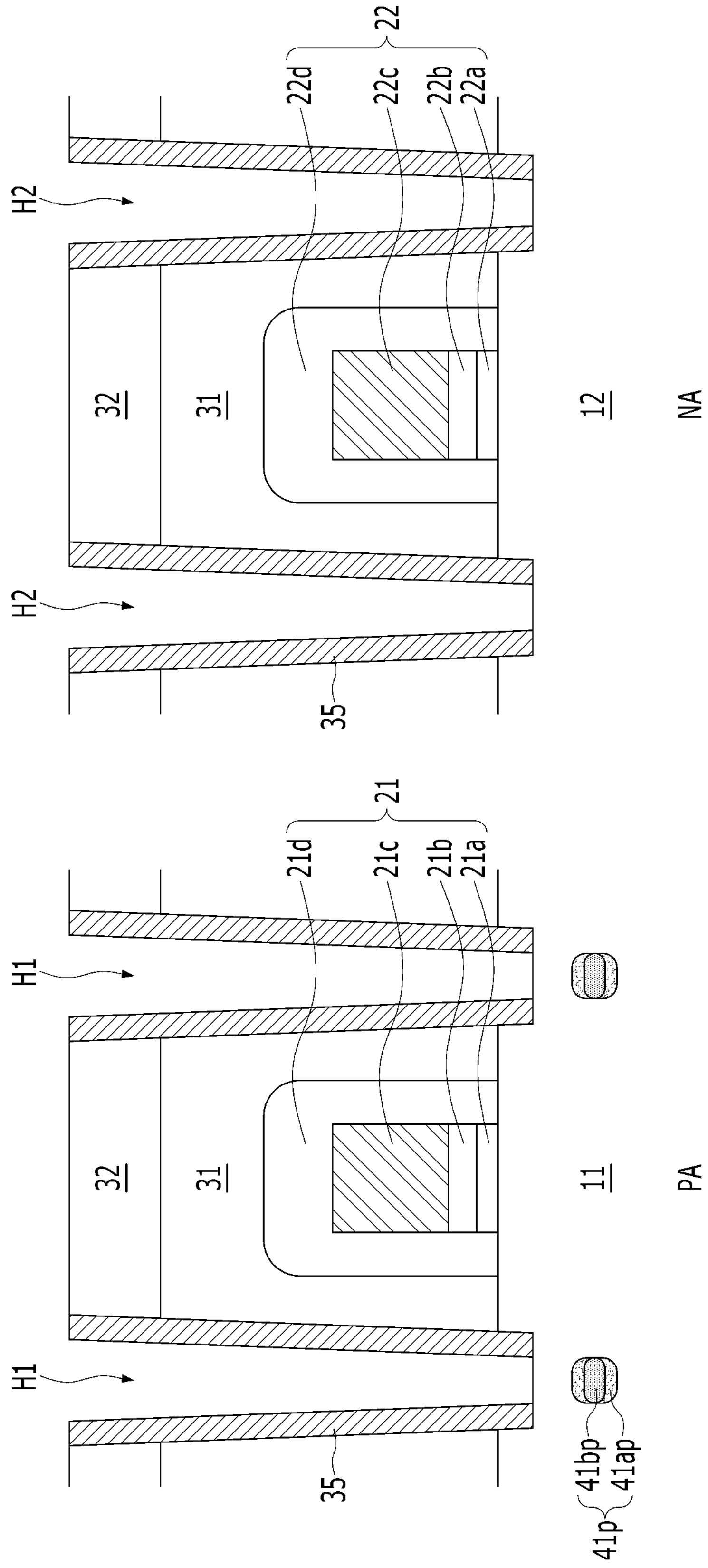

Referring to FIG. 8, the method may further include removing the first mask pattern M1, and performing an etch-back process to remove the lining layer 35 on the bottom surfaces of the first and second holes H1 and H2. The surfaces of the first and second active regions 11 and 12 may be exposed again in the lower portions of the first and second holes H1 and H2. The lining layer 35 on the second interlayer insulating layer 32 may also be removed.

Figure 9:
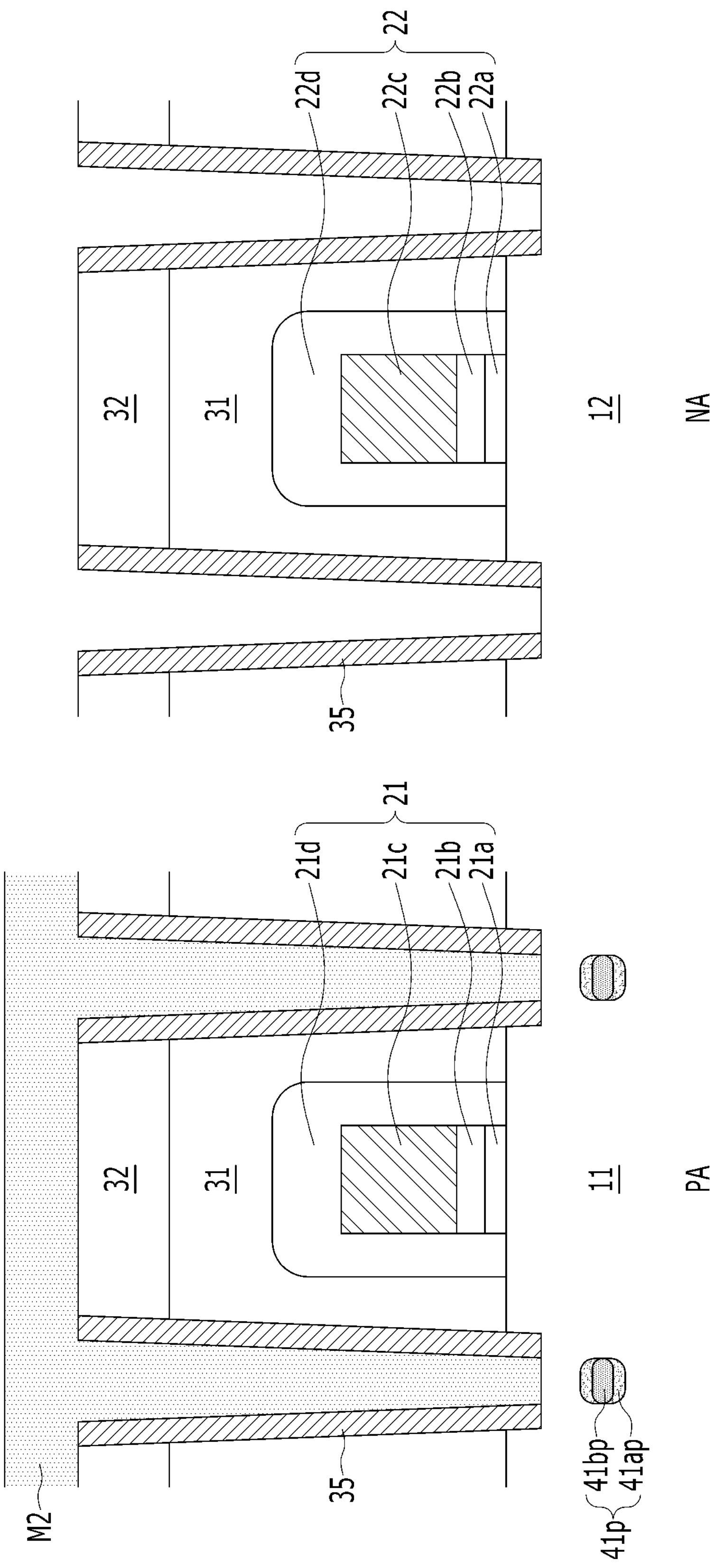

Referring to FIG. 9, the method may further include forming a second mask pattern M2 covering the first area PA and exposing the second area NA. The second mask pattern M2 may fill the first holes H1. Forming the second mask pattern M2 may include performing a photolithography process. For example, the second mask pattern M2 may include a polymeric organic material such as a photoresist.

Figure 10:
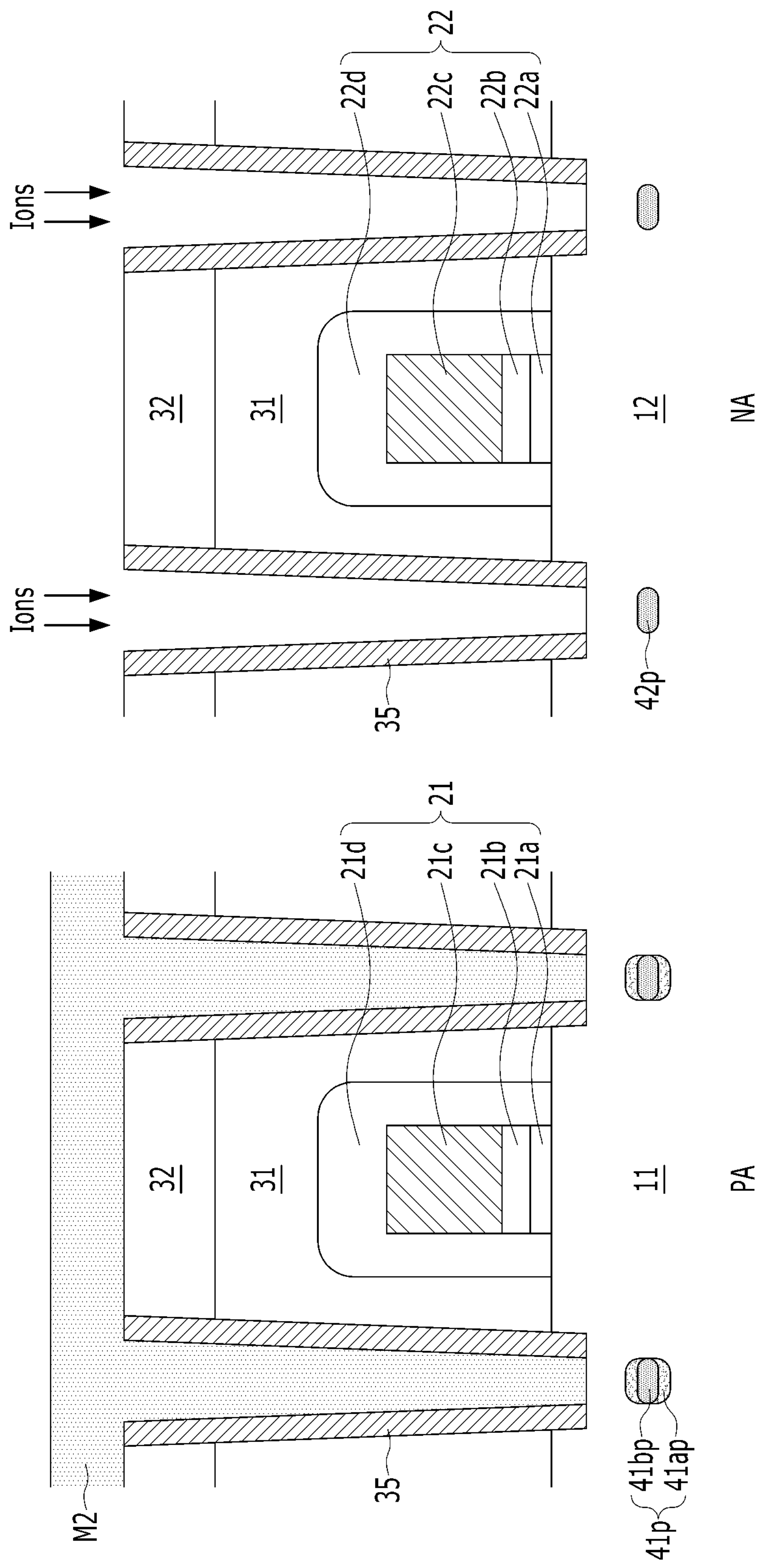

Referring to FIG. 10, the method may further include forming second preliminary ion implantation regions 42*p* in the second active region 12 exposed in the lower portions of the second holes H2 in the second area NA by performing a second ion implantation process. The second ion implantation process may include implanting arsenic (As) ions, phosphorus (P) ions, or a combination thereof into the second active region 12 with an energy of about 2 to 6 keV and an ion dose of 3E15/cm2.

Figure 11:
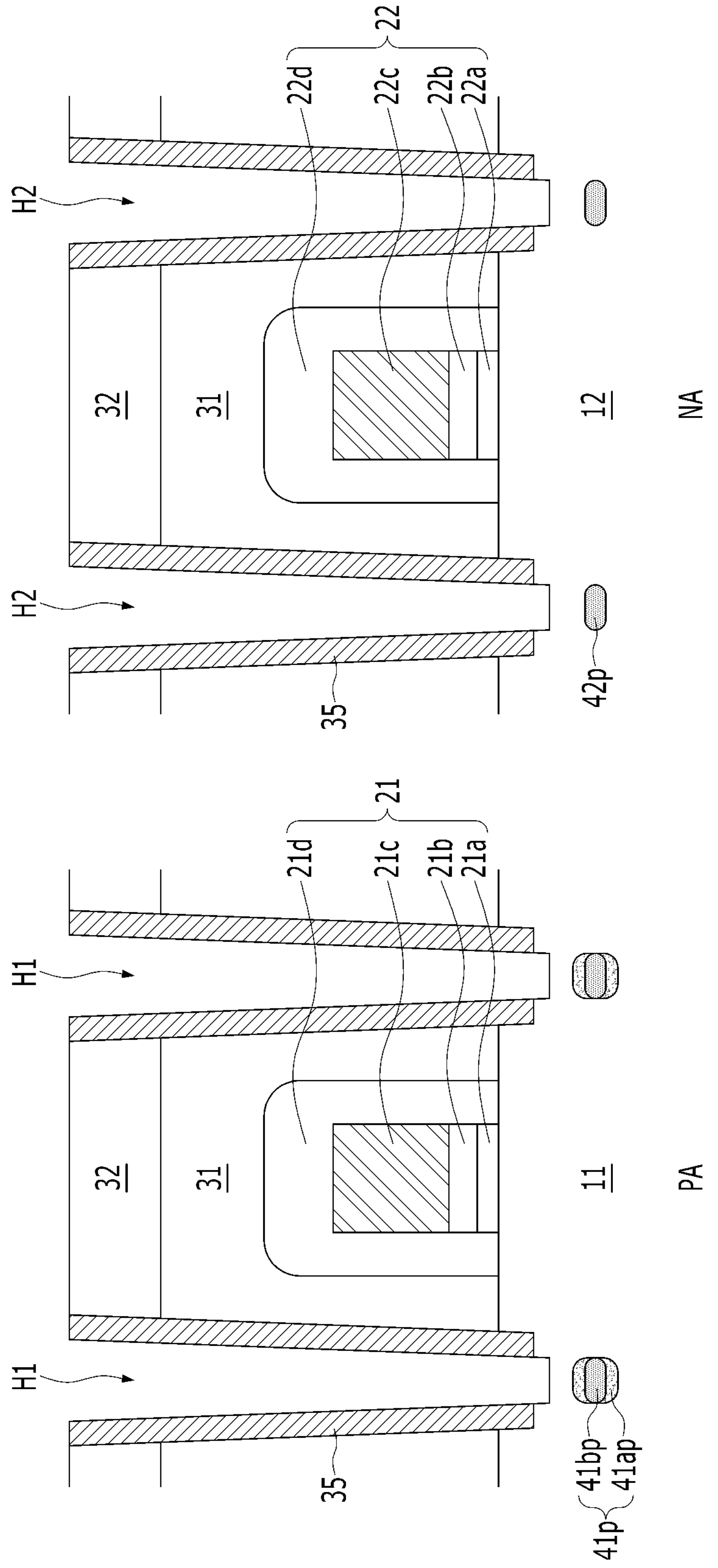

Referring to FIG. 11, the method may further include removing the second mask pattern M2, and curing the surfaces of the first and second active regions 11 and 12 in the lower portions of the first and second holes H1 and H2. The surfaces of the first and second active regions 11 and 12 may be recessed. Accordingly, the first and second holes H1 and H2 may expand into the first and second active regions 11 and 12, respectively. That is, the surfaces of the first and second active regions 11 and 12 exposed in the lower portions of the first and second holes H1 and H2 may be recessed lower than the surfaces of the first and second active regions 11 and 12 which are not exposed in the first and second holes H1 and H2, respectively. The surfaces of the first and second active regions 11 and 12 may be spaced apart from the first and second ion implantation regions 41 and 42.

Figure 12:
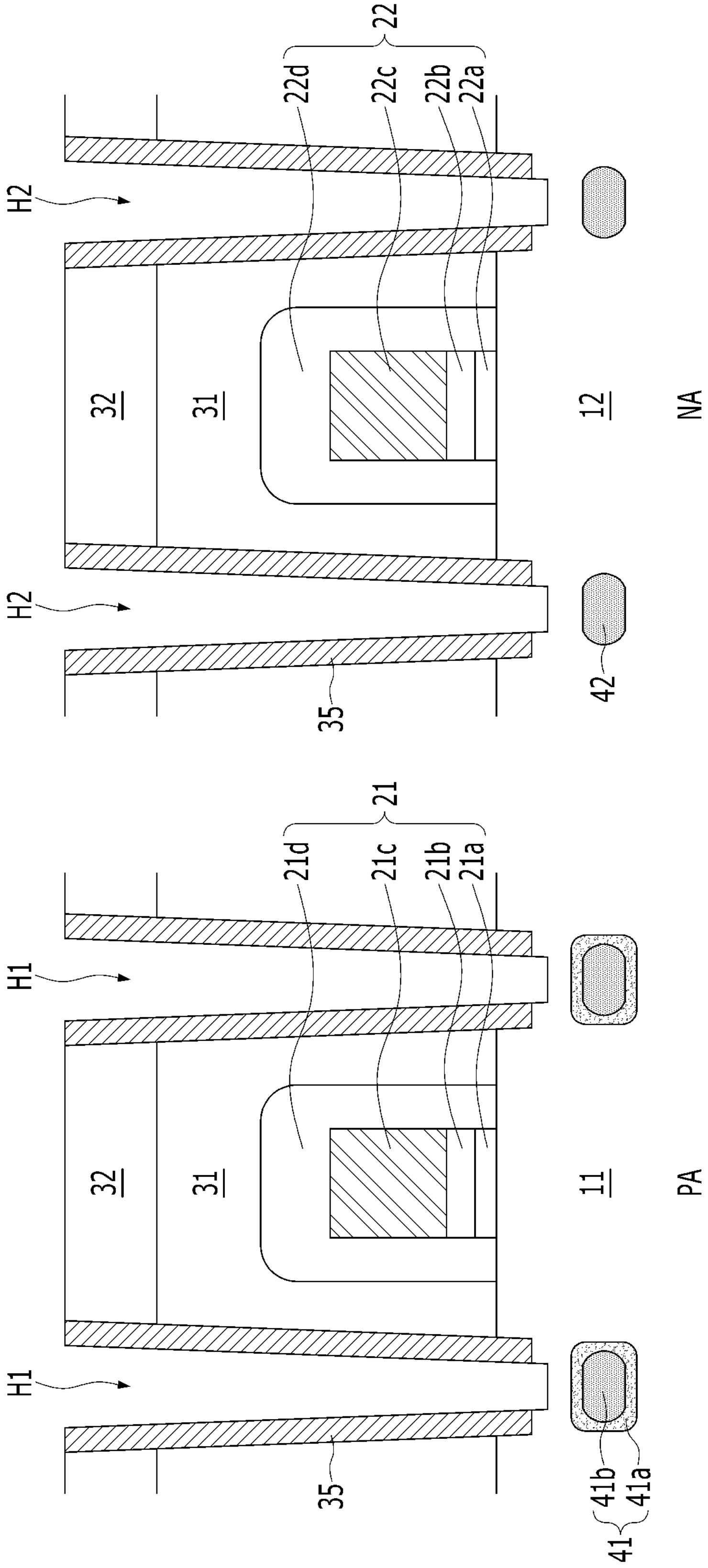

Referring to FIG. 12, the method may further include diffusing ions in the first and second preliminary ion implantation regions 41*p* and 42*p* by performing a thermal treatment process such as an annealing process. Volumes of the first and second preliminary ion implantation regions 41*p* and 42*p* may be increased and expanded to form first and second ion implantation regions 41 and 42. Diffusion of the boron (B) ions in the first preliminary inner ion implantation regions 41*bp* of the first preliminary ion implantation region 41*p* may be prevented by the carbon (C) ions or fluorine (F) ions in the first preliminary outer ion implantation regions 41*ap*.

Figure 13:
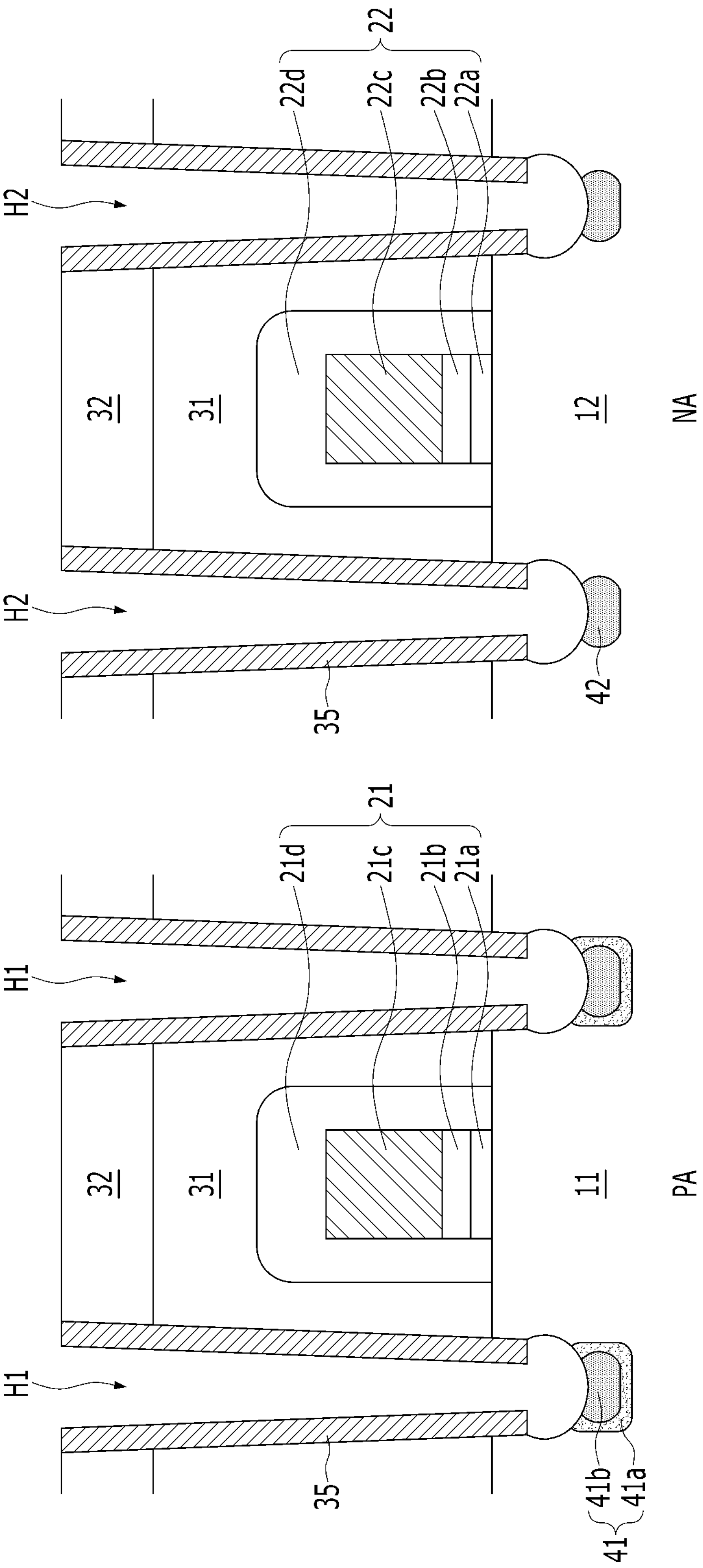

Referring to FIG. 13, the method may include widening the lower portions of the first and second holes H1 and H2 by performing a widening process. The widening process may include an isotropic etching process. That is, the surfaces of the recessed first and second active regions 11 and 12 exposed in the lower portions of the first and second holes H1 and H2 may be partially removed. The widened lower portions of the first and second holes H1 and H2 may be formed in a bulb shape. For example, the widening process may include a wet etching process. For example, the wet etching process may be performed using a chemical mixture or a gas mixture containing at least two (or more) of hydrofluoric acid (HF), nitric acid (HNO3), hydrochloric acid (HCl), hydrogen peroxide (H2O2), acetic acid (CH3COOH), potassium hydroxide (KOH), propanol (C3H8O), water (H2O), and hydrogen (H2).

Figure 14:
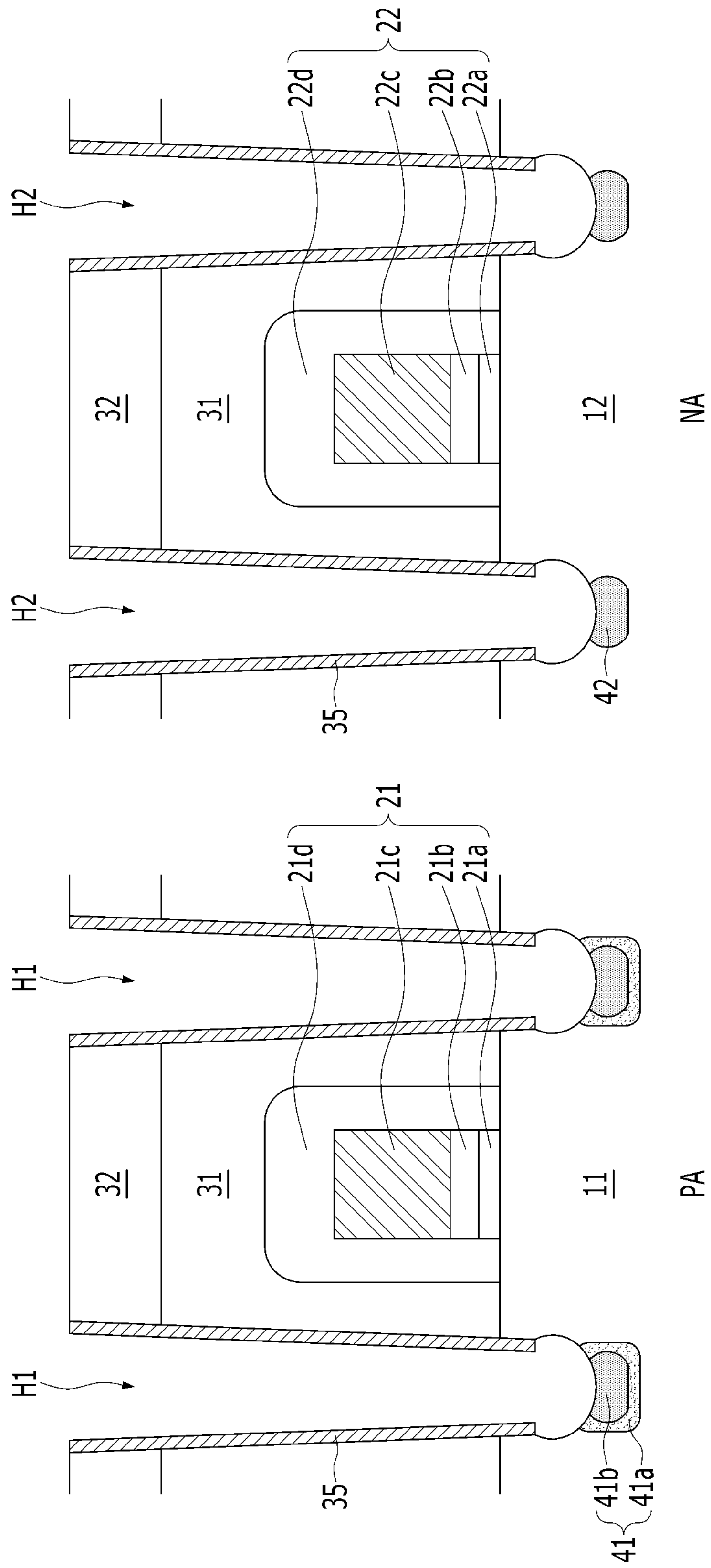

Referring to FIG. 14, the method may further include performing a surface treatment process. The surface treatment process may include a wet cleaning process, a wet peeling process, and/or a wet thinning process. The surface treatment process may include removing contaminants (e.g., a native oxide, etc.) from the surface of the first and second active regions 11 and 12 exposed in the lower portions of the widened first and second holes H1 and H2. The lining layer 35 may become thinner by the surface treatment process. The surface treatment process may be performed using a chemical mixture or a gas mixture including at least two (or more) of hydrofluoric acid (HF), phosphoric acid ($H_3PO_4$), nitrogen fluoride ($NF_3$), hydrogen ($H_2$), nitrogen ($N_2$), and water ($H_2O$). In this process, the lining layer 35 may be thinned so that the first and second holes H1 and H2 may be expanded and widened.

Figure 15:
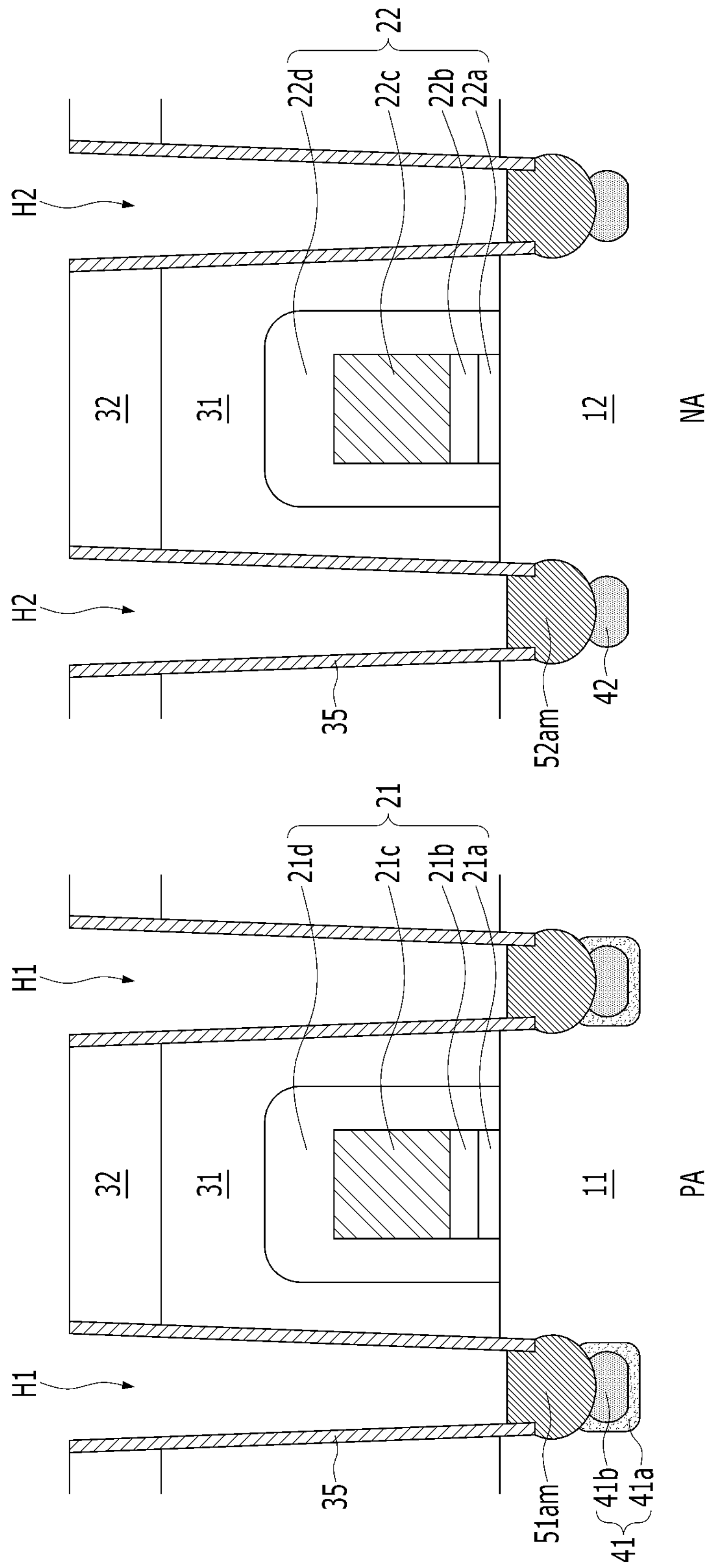

Referring to FIG. 15, the method may further include forming first and second metal layers 51*am* and 52*am* in the widened lower portions of the first and second holes H1 and H2 by performing a deposition process such as a physical vapor deposition (PVD) process. The first and second metal layers 51*am* and 52*am* may include a metal for becoming a silicide layer. For example, the first and second metal layers 51*am* and 52*am* may include for example cobalt (Co). In one embodiment, the first and second metal layers 51*am* and 52*am* may include one or more of nickel (Ni), tungsten (W), titanium (Ti), or other silicide metals. The first and second metal layers 51*am* and 52*am* may be formed on the top surface of the second interlayer insulating layer 32.

Figure 16:
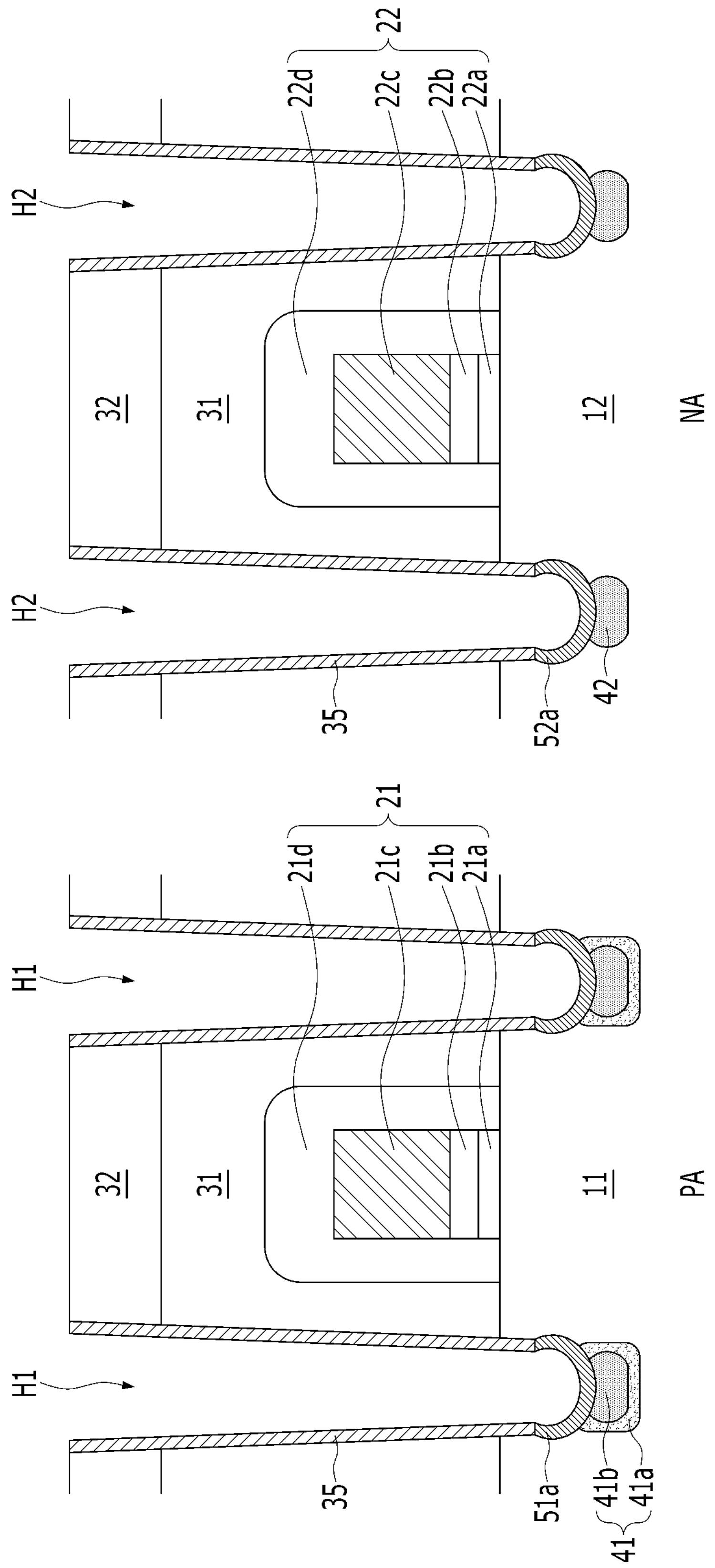

Referring to FIG. 16, the method may further include forming first and second metal silicide layers 51*a* and 52*a* on the surfaces of the first and second active regions 11 and 12 in the widened lower portions of the first and second holes H1 and H2. The first and second metal layers 51*am* and 52*am* may be silicided and may be formed into first and second metal silicide layers 51*a* and 52*a* conformally formed on the surfaces of the first and second active regions 11 and 12 in the widened lower portions of the first and second holes H1 and H2. Remaining portions of the first and second metal layers 51*am* and 52*am* that are not silicided may be removed. The first and second metal silicide layers 51*a* and 52*a* may include cobalt silicide (CoSi).

Figure 17:
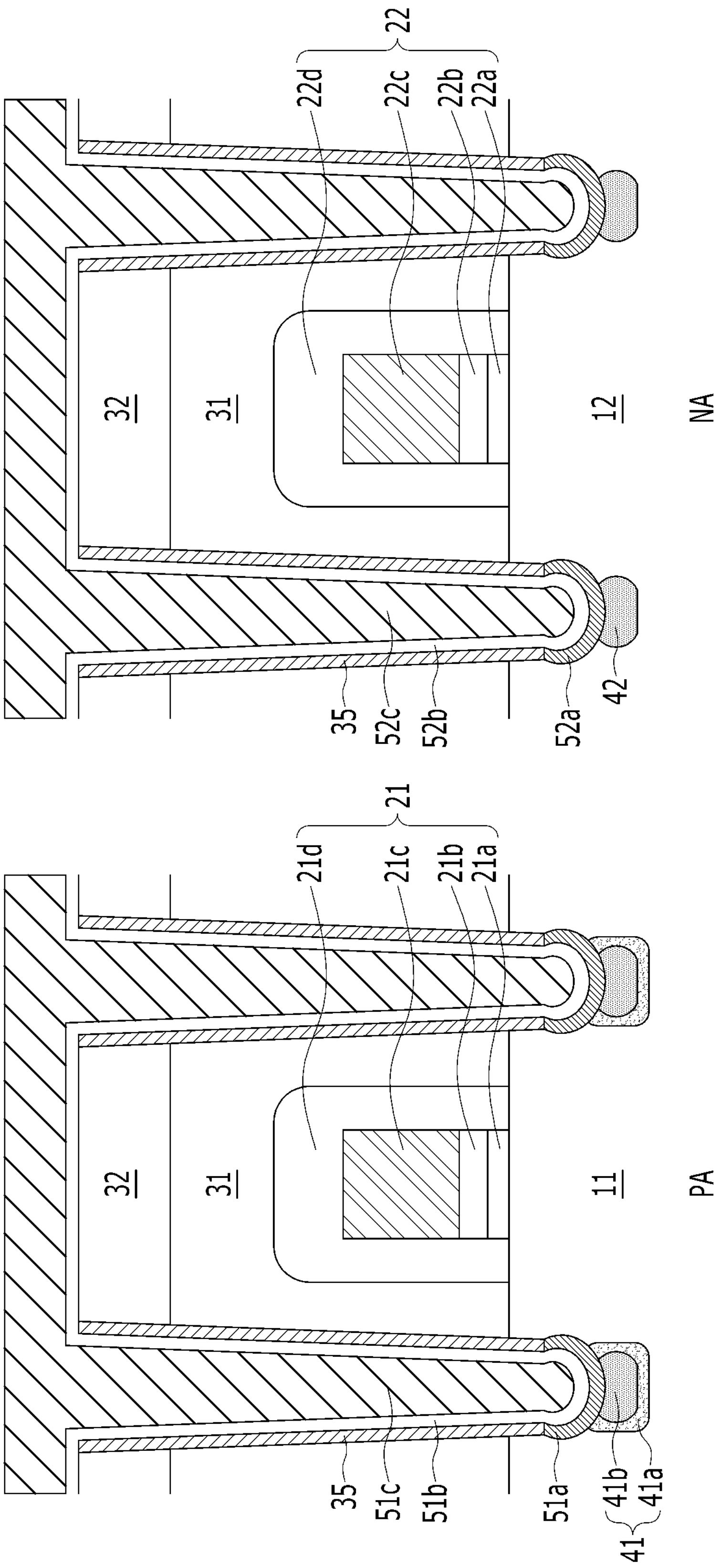

Referring to FIG. 17, the method may further include forming first and second plug barrier layers 51*b* and 52*b*, and first and second plugs 51*c* and 52*c* in first and second holes H1 and H2 by performing deposition processes. The first and second plug barrier layers 51*b* and 52*b* may be conformally formed on inner walls of the first and second holes H1 and H2 and inner surfaces of the first and second metal silicide layers 51*a* and 52*a*. The first and second plugs 51*c* and 52*c* may completely fill the first and second holes H1 and H2.

Thereafter, the method may further include planarizing the first and second plug barrier layers 51*b* and 52*b* and the first and second plugs 51*c* and 52*c* by performing a planarization process. Portions of the first and second plug barrier layers 51*b* and 52*b* and the first and second plugs 51*c* and 52*c* on the second interlayer insulating layer 32 may be removed. First plug structures 51 including the first metal silicide layers 51*a*, the first plug barrier layer 51*b*, and the first plugs 51*c*, and second plug structures 52 including the second metal silicide layers 52*a*, the second plug barrier layer 52*b*, and the second plugs 52*c* may be formed. The method may further include forming the first and second metal interconnections 55 and 56 on the first and second plug structures 51 and 52, respectively. Each of the first and second metal interconnections 55 and 56 may include interconnection barrier layers and interconnection plugs.

According to the embodiments of the present disclosure, leakage current and resistance of a transistor structure and a plug structure formed on active regions having an {100} crystal plane can be lowered.

Although the present disclosure has been described with respect to specific embodiments, it should be understood that the embodiments are illustrative and not limiting of the present disclosure. Further, those skilled in the art will appreciate that various substitutions, changes, and modifications may be made without departing from the spirit and scope of the present disclosure.

What is claimed is:

1. A semiconductor device comprising:

a substrate having an N-type active region and a P-type active region, wherein each of the N-type active region and the P-type active regions has an {100} crystal plane;

a first ion implantation region in the N-type active region of the substrate;

a first plug structure positioned over the N-type active region and vertically aligned with the first ion implantation region;

a second ion implantation region in the P-type active region of the substrate; and a second plug structure positioned over the P-type active region and vertically aligned with the second ion implantation region, wherein:

the first ion implantation region includes a first outer ion implantation region and a first inner ion implantation region, the first outer ion implantation region surrounds a lower surface and side surfaces of the first inner ion implantation region, lower ends of the first and second plug structures protrude downward into the N-type and P-type active regions, respectively, a plug having a bulb shaped lower end;

a plug barrier layer having a lower end conformally surrounding the lower end of the plug; and a cobalt silicide layer conformally surrounding the lower end of the plug barrier layer in a bowl shape, the first outer ion implantation region includes at least one of carbon (C) ions and fluorine (F) ions, the first inner ion implantation region includes at least one of germanium (Ge) ions and boron (B) ions, and the second ion implantation region is a single region and includes at least one of arsenic (As) and phosphorus (P).

2. The semiconductor device of claim 1, wherein:

the first outer ion implantation region does not include the boron (B) ions, and the first inner ion implantation region further includes at least one of carbon (C) ions and fluorine (F) ions.

3. The semiconductor device of claim 1, wherein each of the first and second plug structures further includes an insulating lining layer surrounding side surfaces of the first and second plug barrier layers.

4. The semiconductor device of claim 1, wherein the lower end of the first plug structure is in contact with both the first outer ion implantation region and the first outer ion implantation region.

5. The semiconductor device of claim 1, wherein the lower end of the second plug structure is in contact with the second ion implantation region.

6. A semiconductor device comprising:

a first transistor structure in a first area of a substrate, wherein the first transistor structure includes:

a first gate structure;

a first ion implantation region in a first active region in the first area of the substrate and positioned adjacent to the first gate structure; and a first plug structure extending in a vertical direction over the first active region and vertically aligned with the first ion implantation region, wherein:

the first ion implantation region includes a first outer ion implantation region and a first inner ion implantation region, the first outer ion implantation region surrounds a lower surface and side surfaces of the first inner ion implantation region in a bowl shape, the first outer ion implantation region includes at least one of carbon (C) ions and fluorine (F) ions, and the first inner ion implantation region includes at least one of germanium (Ge) ions and boron (B) ions wherein the first plug structure includes:

a first plug having a lower end, the lower end of the first plug having a bulb shape and protruding downward into the first inner ion implantation region, a first plug barrier layer conformally surrounding the lower end of the first plug, and a first metal silicide layer surrounding the first plug barrier layer in a bowl shape, wherein the first metal silicide layer is in contact with both the first outer ion implantation region and the first inner ion implantation region.

7. The semiconductor device of claim 6, wherein:

the first outer ion implantation region does not include boron (B) ions, and the first inner ion implantation region further includes at least one of carbon (C) ions and fluorine (F) ions.

8. The semiconductor device of claim 6, further comprising:

a second transistor structure in a second area of the substrate, wherein the second transistor structure includes:

a second gate structure;

a second ion implantation region in a second active region in the second area of the substrate and positioned adjacent to the second gate structure; and a second plug structure extending in the vertical direction over the second active region and vertically aligned with the second ion implantation region, wherein the second ion implantation region is a single region including at least one of arsenic (As) ions and phosphorus (P) ions.

9. The semiconductor device of claim 8, wherein a lower end of the second plug structure is in contact with the second ion implantation region.

10. The semiconductor device of claim 8, wherein the second plug structure includes:

a second plug having a lower end, the lower end of the second plug having a bulb shape and protruding downward into the second ion implantation region;

a second plug barrier layer conformally surrounding the lower end of the second plug; and a second metal silicide layer surrounding the second plug barrier layer in a bowl shape.

11. The semiconductor device of claim 10, wherein each of the first and second metal silicide layers includes cobalt silicide (CoSi).

12. The semiconductor device of claim 6, wherein each of the first and second active regions has an {100} crystal plane.

13. A semiconductor device comprising:

a first ion implantation region in a PMOS area of a substrate;

a second ion implantation region in an NMOS region of the substrate;

a first plug structure protruding downward into the first ion implantation region; and a second plug structure protruding downward into the second ion implantation region, wherein the first ion implantation region includes a first inner ion implantation region and a first outer ion implantation region, the first outer ion implantation region surrounding a lower surface and side surface of the first inner ion implantation region, wherein the first plug structure includes:

a first plug having a rounded lower end;

a first plug barrier layer surrounding the rounded lower end of the first plug; and a first metal silicide layer conformally surrounding a lower end of the first plug barrier layer, wherein the second plug structure includes:

a second plug having a rounded lower end;

a second plug barrier layer surrounding the rounded lower end of the second plug; and a second metal silicide layer conformally surrounding a lower end of the second plug barrier layer, wherein the first metal silicide layer is in contact with both the first outer ion implantation region and the first inner ion implantation region.

14. The semiconductor device of claim 13, wherein the substrate has an {100} crystal plane.

15. The semiconductor device of claim 13, wherein the rounded lower end of each of the first and second plugs has a bulb shape.

16. The semiconductor device of claim 13, wherein the lower end of each of the first and second plug barrier layer has a bowl shape.

17. The semiconductor device of claim 13, wherein each of the first and second metal silicide layers includes cobalt silicide.

18. The semiconductor device of claim 13, wherein each of the first and second metal silicide layers has a bowl shape.

19. The semiconductor device of claim 13, wherein the first inner ion implantation region includes germanium and boron, and wherein the first outer ion implantation region includes at least one of carbon and fluorine.

20. The semiconductor device of claim 13, wherein the second ion implantation region include at least one of arsenic and phosphorus.

* * * * *